United States Patent [19]

Hosten et al.

[11] Patent Number: 4,986,888
[45] Date of Patent: Jan. 22, 1991

[54] ELECTROPLATING APPARATUS FOR PLATE-SHAPED WORKPIECES

[75] Inventors: Daniel Hosten, Handzame; Lothar Floegel, Neuried, both of Fed. Rep. of Germany

[73] Assignee: Siemens Aktiengesellschaft, Berlin and Munich, Fed. Rep. of Germany

[21] Appl. No.: 363,522

[22] Filed: Jun. 8, 1989

[30] Foreign Application Priority Data

Jul. 7, 1988 [DE] Fed. Rep. of Germany ....... 3823072

[51] Int. Cl.$^5$ .............................................. C25D 17/00
[52] U.S. Cl. ................................ 204/198; 204/224 R; 204/275
[58] Field of Search .................... 204/198, 206, 224 R, 204/275

[56] References Cited

U.S. PATENT DOCUMENTS

| | | | |
|---|---|---|---|
| 4,162,952 | 7/1979 | Tribout | 204/198 X |
| 4,459,183 | 7/1984 | Brady et al. | 204/198 X |
| 4,761,213 | 8/1988 | Hosten | 204/198 |
| 4,772,361 | 9/1988 | Dorsett et al. | 204/206 X |
| 4,800,001 | 1/1989 | Ott et al. | 204/198 X |
| 4,832,811 | 5/1989 | Hosten | 204/198 |

*Primary Examiner*—Donald R. Valentine
*Attorney, Agent, or Firm*—Hill, Van Santen, Steadman & Simpson

[57] ABSTRACT

An electroplating device for sheet-like circuit boards characterized by an upper and lower electrode extending on opposite sides of a path for the boards, electrolyte headers being arranged adjacent the inlet and the outlet of the apparatus above and below the path for the boards and wash jets being arranged above the path for discharging electrolyte solution vertically against the boards as they pass therethrough.

17 Claims, 1 Drawing Sheet

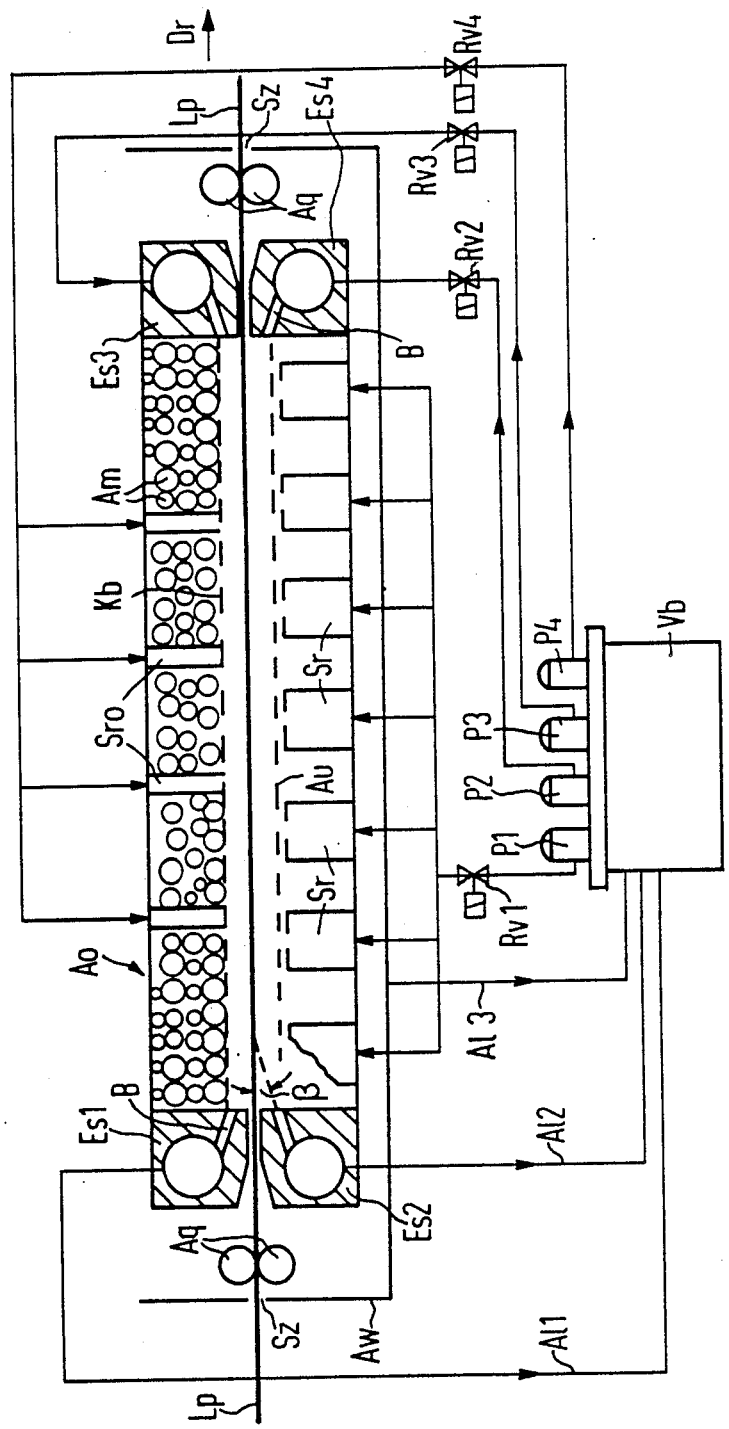

ELECTROPLATING APPARATUS FOR PLATE-SHAPED WORKPIECES

BACKGROUND OF THE INVENTION

The present invention is directed to an electroplating apparatus for plate-shaped workpieces which are conveyed through the apparatus in a horizontal plane and are particularly designed for handling perforated printed circuit boards. The apparatus has at least one anode arranged above the path and at least one anode arranged below the path extending parallel to the path and to the upper anode, electrolyte collectors or headers being directed transversely relative to the path and being arranged above and below the path at the inlet side and at the discharge side, respectively, said collector means having openings for the emission and removal of electrolytic solutions that are directed between the path and the upper or, respectively, lower anode.

An electroplating apparatus having an arrangement forming the path for transporting plates, such as printed circuit boards, in a horizontal direction through the apparatus between an upper anode and a lower anode, said apparatus having electrolytic header means extending transverse relative to the path at the inlet side and at the discharge side above and below the path with electrolyte collectors having openings for the emission and/or collection of electrolyte is disclosed in an allowed U.S. patent application Ser. No. 147,294, filed Jan. 22, 1988, which issued as U.S. Pat. No. 4,832,811 on May 23, 1989, whose disclosure is incorporated by reference thereto and which claims priority from German Application P No. 37 02 229, which was also the basis of published European Patent Application No. 0 276 725.

With an electroplating apparatus constructed in the above manner, the quality of the electro-deposited layers can be improved, particularly in view of the uniform distribution of the layer thickness, a high adhesion and a good ductility when compared to traditionally constructed electroplating devices.

The structure disclosed in the above-mentioned U.S. patent application is based on the perception that qualitatively high-grade surfaces of the electro-deposited layer can be guaranteed only on the basis of flow components of the electrolyte liquid directed in the throughput direction of the workpieces and that such flow components in the longitudinal direction can be realized by the described provision of the electrolyte headers. However, flow components, that are vertically directed onto the surface of the workpiece, should not be eliminated, since they can continue to be important for the production of through-contacts in the perforated printed circuit boards.

The flow components in the longitudinal direction can be produced both by the emission as well as by the removal of the electrolyte solution through the openings of the electrolyte headers. Especially beneficial results, however, are achieved when at least one of the electrolyte headers is intended for the emission of the electrolyte solution.

According to the preferred embodiment of the U.S. application, two electrolyte headers are intended for the emission or input and two electrolyte headers are intended for the collection of the electrolyte solution. Other improvements in the quality of the electro-deposited layer can be achieved, in this case, when the two electrolyte headers arranged at the outlet side are intended for the emission of the electrolyte solution. In other words, this means that the flow components in the longitudinal direction are directed opposite the throughput direction of the workpiece in the apparatus.

It has also proven especially beneficial, particularly in view of good flooding of the holes in the printed circuit board, when the electrolyte solution for the electrolyte headers intended for the emission can be supplied via separate pumps. An especially effective flooding of the holes can be achieved in that a greater quantity of the electrolyte solution is supplied to the electrolyte headers arranged above the throughput path than that which is supplied to the electrolyte header arranged under the throughput path. This is particularly advantageous when the workpieces are to be additionally washed from below.

According to a further development of the device in the above-mentioned U.S. application, it is provided that the openings are directed obliquely onto the throughput path at a slight angle of attack. As a result of this measure, which can be easily realized in structural terms, the exit or entrance orifice of the openings can be brought extremely close to the surface of the passing workpieces.

It has also proven advantageous when the openings are introduced into the electrolyte headers in the form of bores uniformly arranged over the width of the path. Given a low structural outlie when compared to through slots in the transverse direction, such openings enable a more uniform distribution of the desired flow components.

Finally, it has proven particularly beneficial when the upper anode is fashioned as a soluble anode having a soluble anode material arranged on a sieve-shaped or lattice-shaped carrier. The advantage of a soluble anode are, thus, achieved so that a constant distance from the passing workpiece is simultaneously guaranteed. In particular, the combination of such an upper anode with an insoluble, lower anode achieves optimum conditions in view of the scatter of the layer thicknesses and the distribution of the layer thicknesses on the surface of the workpiece, given simple maintenance of the electroplating apparatus.

However, when employing brighteners, a combination of the upper soluble anode and the lower insoluble anode can lead to an increased consumption of brightener. For this reason, a construction of the upper and lower anodes as soluble anodes is to be preferred when the electrolyte solution contains brighteners.

SUMMARY OF THE INVENTION

The object of the present invention is to provide a further improvement of the electrolyte movement in an electroplating apparatus, such as disclosed in the above-mentioned U.S. patent application.

To obtain these objects, the present invention is directed to an improvement in an electroplating apparatus for plate-shaped workpieces which are to be treated in a horizontal throughput path and, particularly, perforated printed circuit boards, said apparatus including at least one anode arranged above and at least one anode arranged below the throughput path and extending parallel thereto, electrolyte headers being directed transversely relative to the throughput path and being arranged at the entrance side and the discharge side, respectively, above and below the path, said electrolyte headers having openings for the discharge of electrolyte solution directly between the throughput path and for receiving the electrolyte fluid flowing between the anodes and the path. The improvements comprise the provision of a plurality of upper washers or surge jets directed transversely relative to the throughput path and chargeable with electrolyte solution being arranged between the two electrolyte headers arranged above the throughput path.

The electrolyte movement can be further improved with such an additional arrangement of the upper wash jets, whereby the intense flooding of the through-contacts of the perforated printed circuit board is to be particularly emphasized. The upper wash jets are then preferably fashioned as slotted or open seamed tubes that have proven more beneficial here for the flooding than individual bores. When the upper wash jets can be charged with an electrolyte solution via a separate pump, then the condition of the electrolyte movement can, again, be adapted better to the respective nature of the workpiece to be treated.

Finally, it has proven especially beneficial, in view of the quality of the deposited layer, when the upper wash jets are arranged in the region of the upper anode. Given employment of an upper soluble anode, it is then, preferably, provided that the upper wash jets are arranged above the sieve-like or lattice-like carrier of the upper soluble anode and are at least partially surrounded by soluble anode material.

Other features and advantages of the present invention will be readily apparent from the following description of the preferred embodiment, the single drawing and the claims.

BRIEF DESCRIPTION OF THE DRAWING

The FIGURE is a schematic, cross sectional view of an electroplating apparatus in accordance with the present invention with the flow circuit diaphragm for the electrolyte.

DESCRIPTION OF THE PREFERRED EMBODIMENT

The principles of the present invention are particularly useful when incorporated in the electroplating apparatus with a horizontal throughput system for through-contacting electroplating of printed circuit boards, as illustrated in the FIGURE. The individual, perforated printed circuit boards Lp, which are to be electroplated, are successively conducted through an electrolyte solution (not shown in detail) on a horizontal throughput path which extends through a collecting tank Aw. As seen in the throughput direction Dr, the printed circuit boards Lp are supplied through a horizontal slot Sz at the admission or inlet side of the collecting tank Aw and pass between two separate squeegee rollers Aq which are at the inlet side. The printed circuit boards are then transported through the electrolyte solution between an upper anode Ao and a lower anode Au with the assistance of a conveying means (not shown in greater detail) until they depart the electroplating apparatus via squeegee rollers Aq at the discharge or outlet side and via a horizontal slot Sz at the discharge side of the tank Aw.

At least in the region between the upper anode Ao and the lower anode Au, the individual printed circuit boards Lp are cathodically contacted via contacting mechanisms that are likewise not shown in greater detail. The upper anode Ao, which is arranged horizontally at a slight distance above the throughput path of the printed circuit boards Lp is a soluble anode that is composed of a basket Kb and contains anode material Am, which is arranged in one layer or in a plurality of layers. The floor of the basket Kb is fashioned as a ribbed mesh or grid. The floor is composed overall of a titanium and forms a carrier for the anode material Am that easily allows the electrolyte solution to pass therethrough. In the present case, the electrolyte solution involves a copper bath and the anode material Am involves copper balls that are often referred to as Cu pellets. The horizontally directed, lower anode Au is fashioned as an insoluble anode and is arranged at a slight distance under the throughput path for the printed circuit boards Lp. The lower anode Au is constructed as a rib mesh or sieve of platinum-plated titanium to make it impossible here for an impediment of the electrolyte exchange and of the flow of the electrolyte solution. Further, the illustrated combination composed of the soluble upper anode Ao and the insoluble anode Au has the advantage that the distance from the printed circuit board Lp passing therebetween remains constant and, thus, that the optimum conditions are achieved in view of the scatter of the layer thicknesses and in view of the distribution of the layer thicknesses on the surface.

Special demands are made of the electrolyte movement in order to guarantee a deposition of bright copper layers during the electro-deposited build-up of the interconnects and through-contacts of the printed circuit board Lp. To this end, a plurality of lower wash nozzles formed by slotted or open-seamed tubes Sr are arranged in the region of the lower anode Au to extend transversely to the throughput path with the slots being directed upward and the tubes being charged with electrolyte solution from a reservoir Vb via a pump P1. In order to vary the quantity being delivered to the slotted tubes Sr, a control valve Rv1 is provided in a line extending from the pump P1 to the tubes Sr, which forms means for generating an upwardly directed vertical flow component from below the path. The slots of the slotted tubes Sr are, thus, directed so that a printed circuit board Lp is essentially flooded in a vertical direction as they proceed over the tubes Sr.

Since the slotted tubes Sr do not yet guarantee the deposition of bright copper layers by themselves, electrolyte headers Es1, Es2, Es3 and Es4 are directed transversely relative to the path and are additionally provided at the inlet side and at the discharge side, respectively, above and below the path. Each of these electrolyte headers Es1-Es4 has a plurality of bores B, which are uniformly arranged over the width of the throughput path and are obliquely directed onto the throughput path at a slight attack angle $\beta$ of, for example, 10°. Thus, the bores B of the upper headers, such as Es1 and Es3, will be directed into the gap-shaped region between the throughput path and the upper anode Ao, whereas the bores B of the lower headers, such as Es2 and Es4, will be directed into the gap between the lower anode Au and the path.

The electrolyte header Es4 is arranged at the discharge side under the path and is charged with an electrolyte solution from the reservoir Vb by a pump P2 having a discharge line extending to the header Es4, which line contains a control valve Rv2. The supplied electrolyte solution then emerges from the bores B of the electrolyte header Es4 with an essentially horizontal velocity component that proceeds along the underside of the printed circuit board Lp and in a direction opposite to the direction of movement of the board through the device, which is indicated by the arrow Dr.

The electrolyte header Es3, which is arranged on the discharge side above the throughput path is charged with an electrolyte solution from the reservoir Vb by a pump P3, which has a discharge line containing a control valve Rv3 for regulating the quantity supplied to the header Es3. The supplied electrolyte solution then emerges from the bores B of the electrolyte header Es3 with an essentially horizontal velocity component that proceeds along the upper side of the printed circuit boards Lp and is directed opposite to the direction Dr.

The horizontal velocity components of the electrolyte flow along the upper side and also on the underside of the printed circuit boards Lp can be further promoted by the electrolyte headers Es1 or Es2, respectively, which are disposed at the inlet side, since these are intended for the outflow or removal of electrolyte solution and are connected to the reservoir Vb by flow conduits A11 for the header Es1 and A12 for the header Es2. For further improvement of the electrolyte circulation, the collector tank Aw is also connected to the reservoir Vb by an outlet flow conduit A13.

Given the embodiment set forth above, an electrolyte movement having an extremely good flooding of the holes of the printed circuit board Lp and a strong electrolyte flow along the printed circuit board surface is achieved. The following perimeters were set:

| | |
|---|---|
| Throughput Quantity of Pump P1: | 20,000 liters/hour |
| Exit Velocity: | 1 m/sec |
| Throughput Quantity of Pump P2: | 20,000 liters/hour |
| Exit Velocity: | 2.8 m/sec |
| Throughput Quantity of Pump P3: | 20,000 liters/hour |
| Exit Velocity: | 2.8 m/sec |

The exemplary embodiment that has been set forth merely represents the preferred, first possibility for the electrolyte movement with the assistance of the electrolyte headers Es1-Es4 and the slotted tubes Sr. Additional possibilities that, however, are not intended to represent a subsequent enumeration proceed from the following table:

| | Es1 | Es2 | Es3 | Es4 | Sr |
|---|---|---|---|---|---|
| 1. Possibility | Removal | Removal | Emission | Emission | Emission |
| 2. Possibility | Emission | Emission | Removal | Removal | Emission |
| 3. Possibility | Removal | Emission | Removal | Emission | Emission |
| 4. Possibility | Emission | Removal | Removal | Emission | Emission |

It may be seen that the described arrangement of the electrolyte headers enables a broad influencing of the electrolyte solution and a flexible adaptation of the flow to the workpieces that are to be respectively electroplated.

For further improvement of the electrolyte movement, a plurality of upper, slotted tubes Sro are mounted to extend transversely relative to the throughput path and are arranged in the region of the upper anode Ao. These upper slotted tubes Sro are charged with an electrolyte solution from a reservoir Vb by a pump P4 which has a discharge line containing a control valve Rv4 to vary the flow to the upper slotted tubes. The slots of the upper slotted tubes Sro are arranged inside the anode material Am and are thereby directed such that the printed circuit boards Lp are flooded through the floor of the basket Kb in an essentially vertical direction proceeding from above. The following parameters are set in view of the upper slotted tubes:

| | |
|---|---|
| Throughput Quantity of Pump 4: | 20,000 liters/hour |
| Exit Velocity: | 2.5 m/sec |

Although various minor modifications may be suggested by those versed in the art, it should be understood that we wish to embody within the scope of the patent granted hereon all such modifications as reasonably and properly come within the scope of our contribution to the art.

We claim:

1. An electroplating apparatus for plate-shaped perforated printed circuit boards, said apparatus having a horizontal throughput path between at least one upper anode and at least one bottom anode, said anodes extending parallel to said path, said apparatus having electrolyte headers directed transversely relative to the path being arranged with a pair of headers at the inlet side and a pair of headers at the discharge side with each pair having an upper header above the path and a lower header below the path, said electrolyte headers having openings for the passage of the electrolyte solution, said openings being arranged for discharging into gaps between the path and the upper and lower anodes, respectively, and for withdrawing electrolyte in said gap, and means disposed between said two lower headers for generating an upwardly directed flow component from below said path, the improvements comprising a plurality of upper wash jets being positioned above the throughput path between the upper two electrolyte headers, said upper wash jets extending transversely relative to the throughput path and being chargeable with an electrolyte solution for discharge onto a plate-shaped, perforated printed circuit board passing therethrough.

2. An electroplating apparatus according to claim 1, wherein the upper wash jets are constructed as tubes having an elongated slot.

3. An electroplating apparatus according to claim 2, wherein the upper wash jets are charged with electrolyte via a separate pump.

4. An electroplating apparatus according to claim 3, wherein the upper wash jets are arranged in the region of the upper anode.

5. An electroplating apparatus according to claim 4, wherein the upper wash jets are arranged above a sieve-like carrier of the upper, soluble anode and are at least partially surrounded by soluble anode material.

6. An electroplating apparatus according to claim 1, wherein the upper wash jets are arranged in the region of an upper anode.

7. An electroplating apparatus according to claim 6, wherein the upper wash jets are arranged above a sieve-like carrier of the upper soluble anode and are at least partially surrounded by soluble anode material.

8. An electroplating apparatus according to claim 1, which includes a separate pump for supplying electrolyte solution to the upper wash jets.

9. An electroplating apparatus according to claim 8, wherein the upper wash jets are arranged in the region of the upper anode.

10. An electroplating apparatus according to claim 9, wherein the upper wash jets are arranged above a sieve-like carrier of the upper anode and are at least partially surrounded by soluble anode material.

11. An electroplating apparatus according to claim 1, wherein the upper wash jets are constructed as upper slotted tubes and are arranged in the region of the upper anode.

12. An electroplating apparatus according to claim 11, wherein the upper wash jets are arranged above a sieve-like carrier of the upper anode and are at least partially surrounded by soluble anode material.

13. An electroplating apparatus according to claim 1, wherein said means comprises a plurality of lower wash nozzles formed by parallel tubes extending transverse to the throughout path and having elongated slots.

14. An electroplating apparatus according to claim 13, wherein the upper wash jets are constructed as tubes having an elongated slot, said tubes extending parallel to each other and transverse to the throughput path.

15. An electroplating apparatus according to claim 14, wherein the lower wash nozzles are charged with electrolyte from a reservoir via a first pump and said upper wash jets are charged with electrolyte from said reservoir via a second pump.

16. An electroplating apparatus according to claim 15, wherein the upper wash jets are arranged in the region of the upper anode.

17. An electroplating apparatus according to claim 16, wherein the upper wash jets are arranged above a sieve-like carrier of the upper, soluble anode and are at least partially surrounded by soluble anode material.

* * * * *